United States Patent
Keszler et al.

(10) Patent No.: US 8,062,420 B2
(45) Date of Patent: Nov. 22, 2011

(54) NONLINEAR OPTICAL CRYSTALS AND THEIR MANUFACTURE AND USE

(75) Inventors: Douglas A. Keszler, Corvallis, OR (US); Ning Ye, Corvallis, OR (US)

(73) Assignee: State of Oregon acting by and through the State Board of higher Education on behalf of Oregon State University, Corvallis, OR (US)

(*) Notice: Subject to any disclaimer, the term of this patent is extended or adjusted under 35 U.S.C. 154(b) by 1006 days.

(21) Appl. No.: 11/765,406

(22) Filed: Jun. 19, 2007

(65) Prior Publication Data

US 2008/0043787 A1     Feb. 21, 2008

Related U.S. Application Data

(63) Continuation-in-part of application No. 11/107,367, filed on Apr. 14, 2005, now abandoned.

(60) Provisional application No. 60/562,626, filed on Apr. 14, 2004.

(51) Int. Cl.
    *C30B 29/22*     (2006.01)
(52) U.S. Cl. .................. 117/68; 117/70; 117/71; 117/75
(58) Field of Classification Search .................... 117/68, 117/70, 71, 72, 74, 75
    See application file for complete search history.

(56) References Cited

U.S. PATENT DOCUMENTS

| | | | |
|---|---|---|---|
| 3,057,677 A | 10/1962 | Ballman | |
| 4,231,838 A | 11/1980 | Gier | |
| 4,791,927 A | 12/1988 | Menger | |
| 4,826,283 A | 5/1989 | Chuangtian et al. | |
| 5,030,851 A | 7/1991 | Unternahrer et al. | |
| 5,043,308 A | 8/1991 | Luetkens, Jr. et al. | |
| 5,130,996 A | 7/1992 | Amano et al. | |
| 5,202,891 A | 4/1993 | Sleight et al. | |
| 5,684,813 A | 11/1997 | Keszler | |
| 5,879,803 A | 3/1999 | Masaki et al. | |
| 6,238,593 B1 | 5/2001 | Huguenin et al. | |
| 6,419,855 B1 | 7/2002 | Keszler et al. | |
| 2004/0060501 A1 | 4/2004 | Thomas et al. | |
| 2005/0247918 A1 | 11/2005 | Keszler et al. | |
| 2006/0054864 A1 | 3/2006 | Alekel et al. | |
| 2008/0014135 A1 | 1/2008 | Alekel | |

FOREIGN PATENT DOCUMENTS

CN     1298217     6/2001

(Continued)

OTHER PUBLICATIONS

Dekker et al., "Continuous wave and Q-switched diode-pumped neodymium, lutetium: yttrium aluminium borate lasers," *Optics Communications* 151:406-412, 1998.

(Continued)

*Primary Examiner* — Bob M Kunemund
(74) *Attorney, Agent, or Firm* — Klarquist Sparkman, LLP

(57) ABSTRACT

Described are nonlinear optical (NLO) crystals, including aluminum-borate NLO crystals, that have low concentrations of contaminants that adversely affect the NLO crystal's optical properties, such as compounds that contain transition-metal elements and/or lanthanides, other than yttrium, lanthanum, and lutetium. Some NLO crystals with low concentrations of these contaminants are capable of second harmonic generation at very short wavelengths. Also described are embodiments of a method for making these NLO crystals. Some embodiments involve growing a single NLO crystal, such as an aluminum-borate NLO crystal, from a mixture containing a solvent that is substantially free of harmful contaminants. The described NLO crystals can be used, for example, in laser devices.

12 Claims, 1 Drawing Sheet

FOREIGN PATENT DOCUMENTS

| WO | WO 00/15731 | 3/2000 |
| WO | WO 03/105238 A1 | 12/2003 |
| WO | WO 2004/007352 A2 | 1/2004 |

OTHER PUBLICATIONS

Dekker et al., "2.27-W Q-switched self-doubling Yb:YAB laser with controllable pulse length," *J. Opt. Soc. Am. B* 22(2):378-384, Feb. 2005.

Jung et al., "Phase Transition of Neodymium Yttrium Aluminum Borate with Composition," *Materials Research Bulletin* 31(8):1021-1027, 1996.

Lu et al., "Excited Emission and Self-Frequency-Doubling Effect of $Nd_xY_{1-x}Al_3(BO_3)_4$ Crystal," *Chinese Physics Letters* 3(9):413-416, 1986.

Leonyuk et al., "Entrance of impurities into yttrium aluminum borate crystals," Izvestiia Akademii nauk SSR, Neorganicheskie materialy, vol. 12, Issue 7, pp. 1249-1251, 1976.

Beregi E. et al., "Growth and Morphology of $Nd^{3+}$, $Er^{3+}$ and $Cr^{3+}$ doped $YAl_3(BO_3)_4$ Single Crystals," *Cryst. Res. Technol.*, 1999, 34(45-6): 641-645.

Brenier A., "Tunable Coherent Infrared Generation Near 2.5 μm from Self-Difference Frequency Mixing in $YAl_3(BO_3)_4$:$Nd^{3+}$," *Appl. Opt.* 2004, 43:6007-6010.

Chen, C. et al., "Recent Advances in Nonlinear Optical and Electro-Optical Materials," *Ann. Rev. Mater. Sci.*, 1986, 16:203-243.

Durmanov S.T. et al. "Binary rare-earth scandium borate for diode-pumped lasers," *Optical Materials*, 2001, 18:234-284.

Feigelson R.S., Byer R.L., Route R.K. and Joo G-t., "Search for New Nonlinear Optical Materials," *Center for Nonlinear Optical Materials Annual Report*, C.3., 1995. 3 pages.

Gruber et al., "Spectroscopic properties of nonlinear $NdSc_3(BO_3)_4$", *Journal of Applied Physics*, May 15, 2000, 87(10): 7159-7163.

Jia G. et al., "Growth and Thermal and Spectral Properties of a New Nonlinear Optical Crystal $TmAl_3(BO_3)_4$", *Crystal Growth and Design*, 2005, 5(3):949-952.

Kellendonk F et al.,"On the Luminescence of Bismuth, Cerium, and Chromium and Yttrium Aluminium Borate," *J. Chem. Phys* 1982, 76(3):1194-1201.

Keszler, D. A., "Borates for optical frequency conversion," *J. Current Opinion in Solid State & Materials Science* 1996, vol. 1, pp. 204-211.

Kuz'min O.V. et al. "Cerium scandium borate—an active nonlinear medium for diode-pumped lasers," *Quantum Electronics*, 1998, 28(1):50-54.

Leonyuk N. I. And Leonyuk L.I., "Growth and Characterization of $RM_3(BO_3)_4$ Crystals," *Prog. Crystal Growth and Charact.* 1995, 31:179-278.

Li, J. et al., "The influence of $Yb^{3+}$ concentration on $Yb:Al_3(BO_3)_4$," *Cryst. Res. Technol.*, 2003, 38(10):890-895.

Meyn, J. et al., "Spectroscopic Properties and Efficient Diode-Pumped Laser Operation of Neodymium-Doped Lanthanum Scandium Borate," *J. of Quantum Electronics*, 1994, 30(4):913-917.

Mills A.D., Crystallographic Data for New Rare Earth Borate Compounds, $RX_3(BO_3)_4$, *Inorg. Chem*, 1962, 1:960-961.

Ostroumov, V. et al., "Crystal growth, spectroscopic and laser characterization of Nd : CSB crystals," *J. of Luminescence*, 1997, 72-74:826-828.

Peterson, G. A.,"Studies on New Solid-State Inorganic Borates and Oxoanion Fluorides." Chapter 1, pp. 1-7, 1999 Ph.D. Thesis.

Peterson, G. A. et al., "Trigonal Huntite Borate $CeSc_3(BO_3)_4(CSB)$," Chapter 2, pp. 14-32, 1999 Ph.D. Thesis.

Peterson G.A., Keszler D.A., and Reynolds T.A., "Stoichiometric, trigonal huntite borate $CeSc_3(BO_3)_4$," *Intern. J. Inorg. Mater.* 2000, 2:101-106.

Peterson, Dr. G. A., "Huntite Crystals for UV Nonlinear Optics and Self-Doubled Lasers," *Scientific Materials Corp.*, (Abstract Ballistic Missile Defense Organization Counsel, 2001.)

Wang, P. et al., "Growth and evaluation of ytterbium-doped yttrium aluminum borate as a potential self-doubling laser crystal," *J. Opt. Soc. Am. B.*, Jan. 1999, 16(1):63-69.

Ye, N. et al., "Nonlinear Optical Crystal $Y_xLa_ySc_z(BO_3)_4(x+y+z=4)$," *Chem. Mater.*, 2005, 17:2687-2692.

Ye, N. et al., "Growth of nonlinear optical crystal $Y_{0.57}La_{0.72}Sc_{2.71}(BO_3)_4$," *J. of Crystal Growth*, 2006, 292:464-467.

Koporulina, E.V. et al., "Flux growth of $(Y,RE)Al3(BO_3)_4$ solid solutions (RE=Nd, Gd. Ho, Yb, Lu)," *Journal of Crystal Growth*, 211(1-4), pp. 491-496, Apr. 1, 2000.

Nikolov, V. et al., "A New Solvent for the Growth of $Y1-XNDXAL_3(BO_3)_4$ Single Crystals from High-Temperature Solutions," *Journal of Crystal Growth*, 144(3/04), pp. 187-192, Dec. 2, 1994.

Supplementary European Search Report, Jan. 19, 2009.

Matthews, "The power in crystals," *LaserFocusWorld*, Mar. 2003.

NONLINEAR OPTICAL CRYSTALS AND THEIR MANUFACTURE AND USE

CROSS-REFERENCES TO RELATED APPLICATIONS

This application is a continuation-in-part of U.S. patent application Ser. No. 11/107,367, filed Apr. 14, 2005 now abandoned, which claims the benefit of the earlier filing date of U.S. Provisional Application No. 60/562,626 filed Apr. 14, 2004, which is incorporated by reference herein. Subject matter for all claims herein is disclosed in U.S. Provisional Application No. 60/562,626.

ACKNOWLEDGMENT OF GOVERNMENT SUPPORT

This invention was made in part using funds provided by the National Science Foundation Grant No. ECS-0114017. The United States Government has certain rights in this invention.

FIELD

Disclosed embodiments concern nonlinear optical crystals, particularly nonlinear optical crystals having reduced amounts of certain contaminants relative to known nonlinear optical crystals, such as contaminants that interfere with the optical properties of the nonlinear optical crystals.

BACKGROUND OF THE INVENTION

The optical properties of nonlinear optical (NLO) materials are modified by light passing through the materials. The modification of the optical properties may be caused by an induced electronic charge displacement (polarization) that acts as an oscillating dipole. The oscillating dipole may cause the material to emit a photon. When the polarization of the material is linear, the emitted photon has the same frequency as the light incident upon the material. If the polarization is nonlinear, the frequency of the light emerging from the material may be some integer value times the frequency of the incident light. For example, the net effect of frequency doubling is that two photons with a frequency $\Omega$ combine to generate a single photon having a frequency equal to $2\Omega$. Thus, propagation of the waves in synchronization (phase-matching) allows the light's frequency to double. Frequency doubling also is referred to as second harmonic generation (SHG). NLO materials were discovered to be capable of second harmonic generation in 1961. *Ann. Rev. Mater. Sci.*, 16:203-43 (1986).

Several NLO materials have been recognized in the prior art. For example, $YAl_3(BO_3)_4$ NLO crystals are disclosed in Pu Wang ET AL., *Growth And Evaluation Of Ytterbium-Doped Yttrium Aluminum Borate as a Potential Self-Doubling Laser Crystal*, J. OF THE OPTICAL SOC. OF AM. B, January 1999, at 63-69, which is incorporated herein by reference. NLO crystals, such as $YAl_3(BO_3)_4$ NLO crystals, have been used in a variety of devices. For example, U.S. Pat. No. 5,202,891 describes a neodymium yttrium aluminum borate NLO crystal incorporated into a laser device. U.S. Pat. No. 4,826,283 describes another NLO device made from single crystals of $LiB_3O_5$.

It is known to recrystallize NLO materials to form larger crystals with uniform crystal structures. For example, J. Li ET AL. disclose the formation of $YAl_3(BO_3)_4$ NLO crystals from a flux containing $K_2MoO_2$. See J. Li ET AL., *The Influence of $Yb^{3+}$ Concentration on $Yb:YAl_3(BO_3)_4$*, 38 CRYS. RES. TECH. 890-895 (2003), which is incorporated herein by reference. Aluminum-borate NLO crystals grown with conventional techniques are generally limited to the generation or emission of light at wavelengths greater than 370 nm.

BRIEF SUMMARY OF THE INVENTION

Described herein are nonlinear optical (NLO) crystals that have reduced concentrations of compounds that adversely affect the crystal's optical properties relative to known NLO crystals. These undesirable compounds are present to varying degrees in conventional NLO crystals, particularly conventional aluminum-borate NLO crystals. Some of the disclosed crystals are useful for modifying the wavelength of incident light, such as light emitted by a laser. For example, some of the disclosed crystals are capable of converting an input laser beam of a first wavelength into an output laser beam of a second wavelength, where the second wavelength is some integer value of the incident wavelength and is less than about 300 nm, typically less than about 250 nm, and even more typically less than about 175 nm.

Some of the disclosed crystals have volumes greater than about 0.1 $mm^3$, typically greater than about 1 $mm^3$, and even more typically greater than about 5 $mm^2$. These crystals comprise a primary material and can also comprise one or more secondary materials different from the primary material. In some embodiments that contain secondary materials, any secondary materials that interfere with the generation and/or emission of light at desired wavelengths are present at low concentrations relative to their concentrations in conventional NLO crystals. For example, the secondary materials that interfere with the generation and/or emission of light at desired wavelengths can be present at concentrations of less than about 100 ppm by weight, typically less than about 50 ppm by weight, and even more typically less than about 10 ppm by weight. In other embodiments, the crystals are substantially free of secondary materials that interfere with the generation and/or emission of light at desired wavelengths. The secondary materials that interfere with the generation and/or emission of light at desired wavelengths can be, for example, compounds than contain transition-metal elements and/or lanthanides, other than yttrium, lanthanum, and lutetium. Some of these secondary materials, however, such as tungsten, are present in useful solvents and have a limited effect on the generation and/or emission of light at certain desired wavelengths. In some embodiments, the crystal comprises less than about 100 ppm by weight, typically less than about 50 ppm by weight, and even more typically less than about 10 ppm by weight of secondary materials that interfere with the generation and/or emission of light at desired wavelengths other than tungsten-containing compounds.

The aluminum-borate NLO crystals described include, but are not limited to, aluminum-borate NLO crystals that have chemical structures comprising yttrium, lutetium, or combinations thereof, such as $YAl_3(BO_3)_4$, $LuAl_3(BO_3)_4$, and $Y_{(1-x)}Lu_xAl_3(BO_3)_4$, where x is an integer greater than zero. These materials, when crystallized to crystal sizes useful for optical applications, are new compounds in so far as undesired contaminants that interfere with the generation and/or emission of light at desired wavelengths are substantially reduced or substantially eliminated relative to known crystals.

Also described herein are embodiments of a method for making NLO crystals, particularly aluminum-borate NLO crystals. Some embodiments comprise providing a precursor materials and a solvent or a primary material and a solvent, where the solvent is substantially free of any materials that interfere with the generation and/or emission of light at desired wavelengths, and crystallizing the primary material to form a crystal that is substantially free of any materials that that interfere with the generation and/or emission of light at desired wavelengths. For example, the solvent and the crystal grown from the solvent can be substantially free of transition-metal elements and lanthanides, other than yttrium, lanthanum, and lutetium. As another example, the solvent and the crystal grown from the solvent can be substantially free of molybdenum.

Embodiments of the method can comprise mixing the precursor materials or primary material with the solvent to form a mixture and introducing a seed into the mixture. The seed, such as a crystalline primary material, perhaps consisting essentially of the primary material, can be suspended in the mixture. In some embodiments, recrystallizing the primary material comprises cooling the mixture and withdrawing the crystal from the mixture. Cooling the mixture can comprise cooling the mixture from a first temperature at or above a melting point of the mixture to a second temperature below the melting point of the mixture over a growing period sufficient to grow crystals of a desired size suitable for useful applications, such a growing period typically being longer than about 10 hours. During a portion of the growing period longer than about 2 hours, the mixture can be cooled at a cooling gradient of less than about 2° C. per hour. In some embodiments the second temperature can be, for example, a temperature between about 5° C. and about 100° C. less than the melting point of the mixture.

The embodiments of the method can be used to grow a variety of NLO crystals, particularly aluminum-borate NLO crystals, such as aluminum-borate NLO crystals that have chemical structures comprising yttrium, lutetium, or combinations thereof, such as $YAl_3(BO_3)_4$, $LuAl_3(BO_3)_4$, and $Y_{(1-x)}Lu_xAl_3(BO_3)_4$, where x is an integer greater than zero. Suitable solvents include solvents substantially free of materials that interfere with the generation and/or emission of light at desired wavelengths, including solvents that are substantially free of transition-metal elements and lanthanides, other than yttrium, lanthanum, and lutetium, and solvents that are substantially free of molybdenum. Examples of suitable solvents comprise one or more of the following compounds: $LaB_3O_6$, $MgB_2O_4$, and LiF. In some embodiments, the solvents are substantially free of transition-metal elements and lanthanides, other than yttrium, lanthanum, lutetium, and tungsten. An example of a tungsten-containing solvent is $Li_2WO_4$, which can be used, for example, with $B_2O_3$ to grow $YAl_3(BO_3)_4$ crystals.

The described NLO crystals can be incorporated into a variety of devices, including laser devices. These devices can be used, for example, to detect anomalies on the surface of a substrate or to bore holes in a substrate.

DETAILED DESCRIPTION OF THE INVENTION

Figure 1:
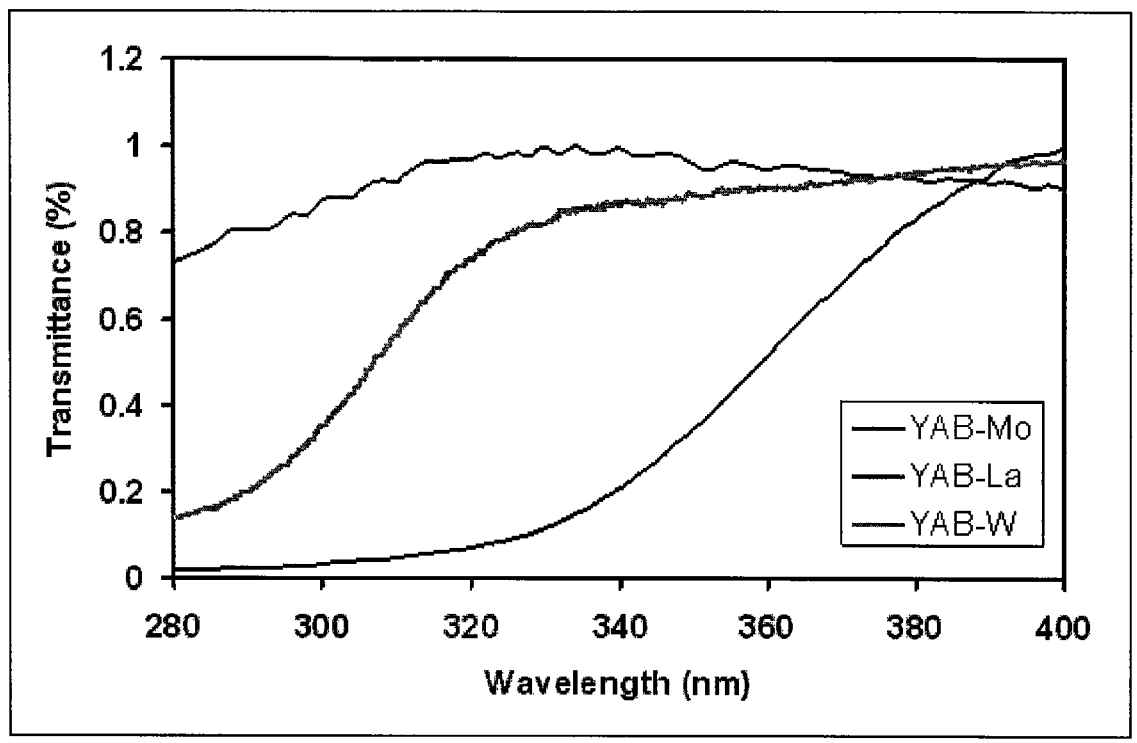
FIG. 1 is a line graph showing the percent transmittance of a $YAl_3(BO_3)_4$ crystal grown with tungsten (YAB—W), the percent transmittance of a $YAl_3(BO_3)_4$ crystal containing molybdenum (YAB—Mo), and the percent transmittance of a $YAl_3(BO_3)_4$ crystal that is substantially free of all transition-metal contaminants (YAB—La), over a wavelength range from 280 nm to 400 nm.

I. Abbreviations
mm: millimeters
NLO: nonlinear optical
nm: nanometers
ppm: parts per million
SHG: second harmonic generation II. Terms The following definitions are provided solely to aid readers and are intended to be no narrower than the meaning of the terms as they would be understood by a person of ordinary skill in the art.

Aluminum-Borate NLO Crystal: A NLO crystal with a chemical formula that includes aluminum and borate. Examples of aluminum-borate NLO crystals include, aluminum-borate NLO crystals that have chemical structures comprising yttrium, lutetium, or combinations thereof, such as $YAl_3(BO_3)_4$, $LuAl_3(BO_3)_4$, and $Y_{(1-x)}Lu_xAl_3(BO_3)_4$, where x is an integer greater than zero.

Laser Beam: A beam of photons produced by a laser device. Laser beams can, for example, be substantially collimated, substantially monochromatic, and substantially coherent.

Molybdenum-Containing Compound: Elemental molybdenum or a compound with a chemical formula that includes molybdenum, such as molybdenum oxide.

Nonlinear Optical Crystal: A crystal that exhibits nonlinear polarization in response to light energy. These crystals comprise a primary material and can also comprise one or more secondary materials.

Primary Material: A crystalline compound having nonlinear optical properties. A primary material forms the bulk of the crystal lattice in a NLO crystal. Primary materials, as initially synthesized or isolated, typically exist in a powder form. The primary powder material must be recrystallized to form a NLO crystal of a suitable size and of a suitable purity for the generation and/or emission of light at a desired wavelength. Alternatively, the primary material can be formed from precursor materials during the crystallization process.

Precursor Material: A material that can be combined with other precursor materials to form a primary material. For example, $Y_2O_3$, $B_2O_3$, and $Al_2O_3$ are precursor materials for the formation of $YAl_3(BO_3)_4$.

Secondary Material: Elements or compounds contained in a NLO crystal other than the primary material. Secondary materials can be incorporated intentionally (such as dopants) or incorporated unintentionally (such as contaminants). Secondary materials can be constituents of the crystal lattice or can exist outside the crystal lattice.

Transition-Metal Containing Compound: Elemental transition metals, or compounds with chemical formulas that include a transition metal, such as transition metal oxides.

Tungsten-Containing Compound: Elemental tungsten, or a compound with a chemical formula that includes tungsten, such as tungsten oxide.

III. Nonlinear Optical Crystal and their Manufacture and Use

Described herein are embodiments of NLO crystals and embodiments of methods for making and using these crystals. The described embodiments are useful for a variety of applications including, but not limited to, laser applications.

All NLO crystals comprise a crystal lattice having at least a primary material. NLO crystals also can include one or more secondary materials. The primary material can, for example, be doped with various dopants to change the optical properties of the crystal. Examples of primary materials include, but are not limited to: $YAl_3(BO_3)_4$, $LuAl_3(BO_3)_4$, $BaB_2O_4$, $BaAl_2B_2O_7$, $K_2Al_2B_2O_7$, $CaAl_2B_2O_7$, $SrAl_2B_2O_7$, $TiOPO_4$, $KTiOAsO_4$, $RbTiOPO_4$, $RbTiOAsO_4$, $CsTiOAsO_4$, $LiNbO_3$, $KNbO_3$, $AgGaS_2$, $AgGaSe_2$, $KH_2PO_4$, $KD_2PO_4$, $NH_4PO_4$, $CsH_2AsO_4$, $CsD_2AsO_4$, $LiIO_3$, and $LiTaO_3$. These NLO materials may be used alone or in combination.

Among the aluminum-borate NLO crystals, aluminum-borate NLO crystals that have chemical structures comprising yttrium, lutetium, or combinations thereof, such as $YAl_3(BO_3)_4$, $LuAl_3(BO_3)_4$, and $Y_{(1-x)}Lu_xAl_3(BO_3)_4$, where x is an integer greater than zero, are especially well-suited for the generation and/or emission of light at wavelengths shorter than about 300 nm, typically shorter than about 250 nm, and even more typically shorter than about 175 nm.

The utility of NLO crystals, including aluminum-borate NLO crystals, is derived primarily from their optical properties. To achieve the desired optical properties, it is often necessary to grow a single crystal with a relatively continuous crystal structure and very few defects. Furthermore, most applications require that the single NLO crystal be a certain size, such as a size sufficient to make the crystal compatible with an optical device, for example, a laser. Some useful NLO crystals have a volume greater than about 0.1 $mm^3$, typically greater than about 1 $mm^3$, and even more typically greater than about 5 $mm^3$.

Before primary materials are recrystallized to form single crystals of suitable size and purity, the primary material can exist in a powder form comprising amorphous material or very small crystals. The recrystallization process can begin with the primary material in power form or, alternatively, it can begin with precursor materials that can be combined to form the primary material. For example, it is possible to combine precursor materials with a solvent to form a mixture and then crystallize the primary material from that mixture. Useful precursor materials include oxides of each element in the chemical structure of a primary material. For example, for forming $YAl_3(BO_3)_4$, the precursor materials can include: $Y_2O_3$, $B_2O_3$, and $Al_2O_3$. These precursor materials are available commercially, for example, from Sigma-Aldrich (St. Louis, Mo.).

This disclosure describes embodiments of a method for growing useful NLO crystals, such as aluminum-borate NLO crystals, from precursor materials or primary materials that are not yet in a form suitable for NLO crystal applications, i.e., are in their raw form, such as in powder form. Some embodiments involve mixing precursor materials or a primary material with a solvent to form a mixture. This mixture is then cooled and a NLO crystal grows as the mixture cools. The solvent provides a medium in which the elemental components of the primary material can combine in crystal form. Without a solvent, many primary materials, including $YAl_3(BO_3)_4$ and $LuAl_3(BO_3)_4$, tend to decompose unevenly at high temperatures.

Solvents can be chosen to promote the crystallization process by promoting the solubility of the precursor materials. When the precursor materials are acidic, solubility is enhanced when the solvent is basic. Likewise, when the precursor materials are basic, solubility is enhanced when the solvent is acidic. The pH of the solvent can be adjusted to promote solubility, but extreme alkalinity or acidity may have a detrimental effect on crystal growth.

Conventionally, solvents were chosen solely for their effect on the crystallization process. Since the crystal separates from the solvent during the crystallization process, it was thought that the choice of solvent would have little or no effect on the crystals produced by the process. Surprisingly, it has been discovered that certain elements present in conventional solvents are incorporated into crystals grown from mixtures comprising these solvents. For example, $YAl_3(BO_3)_4$ crystals grown in $K_2MoO_2$ contain molybdenum oxide as a secondary material. It has also been discovered that some of these contaminants, although present in small quantities, can substantially affect the optical properties of the crystals grown from mixtures comprising these solvents. For example, these contaminants can interfere with the generation and/or emission of light at desired wavelengths. Conventional $YAl_3(BO_3)_4$ crystals contain contaminants that prevent the crystals from generating and/or emitting light at wavelengths less than 370 nm.

By growing crystals in a mixture free, or at least substantially free, of certain contaminants, it is possible to produce crystals with improved optical properties. For example, it is possible to grow aluminum-borate crystals, such as $YAl_3(BO_3)_4$ and $LuAl_3(BO_3)_4$ crystals, that generate and/or emit laser light at short wavelengths unobtainable with conventional aluminum-borate crystals, such as wavelengths less than about 300 nm, typically wavelengths less than about 250 nm, and even more typically wavelengths less than about 175 nm.

Certain contaminants are more harmful to the optical properties of a NLO crystal than others. For example, some contaminants interfere with the generation and/or emission of light at short wavelengths, such as wavelengths less than about 300 nm, typically wavelengths less than about 250 nm, and even more typically wavelengths less than about 175 nm. Some contaminants prevent NLO crystals from absorbing light at short wavelengths and therefore inhibit frequency mixing processes at these short wavelengths. Some of the contaminants that are incorporated into crystals grown in conventional solvents are compounds than contain elements that exhibit a charge transfer transition in the ultraviolet portion of the electromagnetic spectrum. These compounds interfere with the generation and/or emission of light at ultraviolet wavelengths. For some applications, the detrimental contaminants include compounds that contain transition-metal elements and/or lanthanides, other than yttrium, lanthanum, and lutetium. Table 1 shows the concentration of different elements in a $YAl_3(BO_3)_4$ crystal grown with a conventional solvent. As shown, the $YAl_3(BO_3)_4$ crystal contains 250 ppm by weight of molybdenum.

TABLE 1

| Composition of a $YAl_3(BO_3)_4$ Crystal Grown with a Conventional Solvent | |
|---|---|
| Element | ppm by weight |
| H | not tested |
| Li | 0.15 |
| Be | <0.01 |
| B | major |
| C | not tested |
| N | not tested |
| O | major |
| F | <0.5 |
| Na | 3.0 |
| Mg | 5.0 |
| Al | major |
| Si | 15 |
| P | 0.17 |
| S | 4.0 |
| Cl | 8.0 |
| K | 100 |
| Ca | 6.0 |
| Sc | <0.1 |
| Ti | 0.51 |
| V | ≦1 |

TABLE 1-continued

Composition of a YAl$_3$(BO$_3$)$_4$ Crystal
Grown with a Conventional Solvent

| Element | ppm by weight |
| --- | --- |
| Cr | ≦5 |
| Mn | 0.37 |
| Fe | 10 |
| Co | 0.064 |
| Ni | 0.78 |
| Cu | 1.0 |
| Zn | ≦2 |
| Ga | ≦1 |
| Ge | <0.1 |
| As | 0.88 |
| Se | <0.5 |
| Br | <0.1 |
| Rb | <0.1 |
| Sr | 0.37 |
| Y | major |
| Zr | 1.1 |
| Nb | 0.079 |
| Mo | 250 |
| Ru | <0.1 |
| Rh | <0.1 |
| Pd | <0.1 |
| Ag | <0.5 |
| Cd | <0.5 |
| In | <0.1 |
| Sn | <0.5 |
| Sb | <0.5 |
| Te | <0.1 |
| I | <0.1 |
| Cs | <0.1 |
| Ba | 0.29 |
| La | 170 |
| Ce | 0.54 |
| Pr | 0.11 |
| Nd | ~6000 |
| Sm | 0.1 |
| Eu | 4.0 |
| Gd | 3.0 |
| Tb | 15 |
| Dy | 0.10 |
| Ho | 0.034 |
| Er | 0.089 |
| Tm | 0.42 |
| Yb | <0.1 |
| Lu | 0.37 |
| Hf | <0.1 |
| Ta | <10 |
| W* | 1.2 |
| Re | <0.1 |
| Os | <0.1 |
| Ir | <0.1 |
| Pt | 6.5 |
| Au | <1 |
| Hg | <0.1 |
| Tl | <0.1 |
| Pb | <0.1 |
| Bi | <0.1 |
| Th | <0.01 |
| U | <0.01 |

*Inhomogeneous

In some of the disclosed embodiments, special solvents are used in the crystallization process. These solvents can be substantially free of contaminants that can be incorporated in growing crystals and can change the optical properties of those crystals. For example, these solvents can be substantially free of all transition-metal elements and lanthanides, other than yttrium, lanthanum, and lutetium. In some embodiments, these solvents are substantially free of molybdenum-containing compounds. In some embodiments, the solvent comprises LaB$_3$O$_6$, MgB$_2$O$_4$, LiF, or combinations thereof. The solvents LaB$_3$O$_6$, MgB$_2$O$_4$, and LiF are particularly useful for forming YAl$_3$(BO$_3$)$_4$ crystals.

Table 2 shows the concentration of different elements in a YAl$_3$(BO$_3$)$_4$ crystal grown in a solvent substantially free of molybdenum. As shown, the YAl$_3$(BO$_3$)$_4$ crystal contains 0.15 ppm by weight of molybdenum.

TABLE 2

Composition of a YAl$_3$(BO$_3$)$_4$ Crystal Grown with
a Solvent Substantially Free of Molybdenum

| Element | ppm by weight |
| --- | --- |
| H | Not tested |
| Li | 57 |
| Be | <0.01 |
| B | major |
| C | Not tested |
| N | Not tested |
| O | major |
| F | <0.5 |
| Na | 6.0 |
| Mg | 3.0 |
| Al | major |
| Si | 75 |
| P | 0.81 |
| S | 16 |
| Cl | 20 |
| K | 4.0 |
| Ca | 2.5 |
| Sc | <0.1 |
| Ti | 0.65 |
| V | ≦1 |
| Cr | ≦5 |
| Mn | 0.28 |
| Fe | 10 |
| Co | <0.1 |
| Ni | 0.15 |
| Cu | 0.50 |
| Zn | ≦2 |
| Ga | ≦1 |
| Ge | <0.1 |
| As | <0.5 |
| Se | <0.5 |
| Br | <0.1 |
| Rb | <0.1 |
| Sr | 0.066 |
| Y | major |
| Zr | 0.41 |
| Nb | 0.14 |
| Mo | 0.15 |
| Ru | <0.1 |
| Rh | <0.1 |
| Pd | <0.1 |
| Ag | <0.5 |
| Cd | <0.5 |
| In | <0.1 |
| Sn | <0.5 |
| Sb | <0.5 |
| Te | <0.1 |
| I | <0.1 |
| Cs | <0.1 |
| Ba | 0.15 |
| La | major |
| Ce | 0.56 |
| Pr | 0.063 |
| Nd | 0.15 |
| Sm | <0.1 |
| Eu | <0.1 |
| Gd | 0.20 |
| Tb | 0.038 |
| Dy | 0.29 |
| Ho | 0.29 |
| Er | 0.23 |
| Tm | 0.013 |
| Yb | 1.9 |
| Lu | 0.083 |
| Hf | <0.1 |
| Ta | <10 |
| W | 0.55 |
| Re | <0.1 |
| Os | <0.1 |

TABLE 2-continued

Composition of a YAl$_3$(BO$_3$)$_4$ Crystal Grown with a Solvent Substantially Free of Molybdenum

| Element | ppm by weight |
|---|---|
| Ir | <0.1 |
| Pt | 1.5 |
| Au | <1 |
| Hg | <0.1 |
| Tl | <0.1 |
| Pb | <0.1 |
| Bi | <0.1 |
| Th | <0.01 |
| U | <0.01 |

Several crystal-growing techniques can be used in conjunction with the specially-selected solvents to produce NLO crystals with desirable properties. In some embodiments, the mixture formed by mixing the precursor materials and the solvent, or the primary material in its raw form and the solvent, is heated to a temperature above the melting point of the mixture. The melting point of the mixture varies depending on the type and quantity of the solvent and the type and quantity of the precursor materials or primary material. The melting point and other melt characteristics (such as melt viscosity and melt creeping) also can be varied by introducing various additives into the mixture. Some useful additives are alkali metal salts and alkaline-earth metal salts. These salts can be, for example, oxides, fluorides, or chlorides. The additives are selected so that they will not interfere with at least one, and perhaps plural desired optical properties of the crystal being formed. For example, additives for the formation of NLO crystals that are intended for second harmonic generation at short wavelengths are selected so that they will not prevent the crystal from absorbing light at these short wavelengths.

In some embodiments of the crystal-growing process, a seed is introduced into the melted mixture and the mixture is then cooled slowly from a first temperature to a second temperature. The seed is typically a small crystal of the primary material, often with a crystal structure of uniform orientation. In some embodiments, the seed is suspended in the melted mixture as the mixture is cooled from the first temperature to the second temperature. As the mixture cools, the primary material crystallizes. The crystallization can occur around the seed as a single crystal with a uniform crystal orientation matching the crystal orientation of the seed.

Most of the crystal growth occurs over a growing period during which the mixture is cooled from the first temperature to the second temperature. The first temperature can be a temperature around or above the melting point of the mixture. The second temperature can be a temperature less than the melting point of the mixture, for example, a temperature between about 5° C. and about 100° C. less than the melting point of the mixture. The duration of the growing period depends on the primary material, the solvents, and the size of the desired crystal. Typically, crystals will grow at a rate of about 0.2 to about 0.3 mm per hour. Suitable growing periods are typically longer than about 10 hours. During a portion of the growing period, such as a portion longer than about 2 hours, the mixture can be cooled at a cooling gradient of less than about 2° C. per hour.

Table 3 lists several examples of mixtures containing different combinations of YAl$_3$(BO$_3$)$_4$ (as the primary material) and solvents, along with key melt characteristics of the mixtures. For each mixture, Table 3 lists the melting point, the growing temperature range (i.e. the range between the first temperature and the second temperature), and an example of an appropriate growing period.

TABLE 3

Melt Characteristics for Several YAl$_3$(BO$_3$)$_4$ Mixtures

| Mixture # | Mixture | Melting Point (° C.) | Growing Temperature Range (° C.) | Growing Time (days) |
|---|---|---|---|---|
| 1 | YAl$_3$(BO$_3$)$_4$ + 2LaB$_3$O$_6$ + LiF | 1085 | 1085-1060 | 15 |
| 2 | YAl$_3$(BO$_3$)$_4$ + 2LaB$_3$O$_6$ | 1155 | 1155-1127 | 15 |
| 3 | YAl$_3$(BO$_3$)$_4$ + 1.5LaB$_3$O$_6$ + LiF | 1170 | 1170-1150 | 15 |
| 4 | YAl$_3$(BO$_3$)$_4$ + 1.5LaB$_3$O$_6$ | 1230 | 1230-1200 | 10 |
| 5 | YAl$_3$(BO$_3$)$_4$ + LaB$_3$O$_6$ + 2MgB$_2$O$_4$ | 1130 | 1130-1110 | 10 |
| 6 | YAl$_3$(BO$_3$)$_4$ + 3Li$_2$WO$_4$ + 2B$_2$O$_3$ | 1010 | 1010-920 | 30 |

Among the mixtures represented by Table 3, the crystals formed from mixtures 1-4 exhibited varying degrees of creeping. Crystals grown from mixture 5 exhibited less creeping.

Generally, for the growth of NLO crystals intended for SHG at short wavelengths, it is advantageous to select solvents that do not contain transition-metal elements and/or lanthanides, other than yttrium, lanthanum, and lutetium. However, some solvents containing transition metals are especially effective at promoting melt uniformity of the primary material. It is therefore appropriate, in certain cases, to weigh the potential interference with the crystal's optical properties caused by possible incorporation of the harmful element into the NLO crystal with the beneficial effect of the solvent containing the harmful element. Use of solvents containing transition metals is especially appropriate where the NLO crystal being grown from the solvent is not intended to be used for SHG at very short wavelengths. For example, for the growth of NLO crystals to be used for SHG at wavelengths greater than about 300 nm, a solvent comprising tungsten can be used in some embodiments of the crystal-growing process. One tungsten-containing solvent that is well-suited for the growth of YAl$_3$(BO$_3$)$_4$ crystals is Li$_2$WO$_4$, which can be used in conjunction with B$_2$O$_3$. Crystals grown from mixture 6 as recited in Table 4, which incorporates Li$_2$WO$_4$ and B$_2$O$_3$, were of particularly high quality.

Table 4 shows the concentration of different elements in a YAl$_3$(BO$_3$)$_4$ crystal grown from mixture 6 illustrated in Table 3. Tungsten was incorporated at 550 ppm by weight.

TABLE 4

Composition of a YAl$_3$(BO$_3$)$_4$ Crystal Grown with Li$_2$WO$_4$ and B$_2$O$_3$

| Element | ppm by weight |
|---|---|
| H | not tested |
| Li | 50 |
| Be | <0.01 |
| B | Major |
| C | not tested |
| N | not tested |
| O | not tested |
| F | <0.5 |
| Na | 20 |
| Mg | 7.5 |
| Al | major |
| Si | 50 |

TABLE 4-continued

Composition of a YAl$_3$(BO$_3$)$_4$ Crystal Grown with Li$_2$WO$_4$ and B$_2$O$_3$

| Element | ppm by weight |
|---|---|
| P | 1.0 |
| S | 5.0 |
| Cl | 50 |
| K | 0.90 |
| Ca | 7.0 |
| Sc | ≦0.5 |
| Ti | 0.75 |
| V | 0.55 |
| Cr | 4.0 |
| Mn | 0.055 |
| Fe | 9.0 |
| Co | <0.05 |
| Ni | 0.15 |
| Cu | 0.60 |
| Zn | 1.5 |
| Ga | 0.65 |
| Ge | <0.5 |
| As | <0.5 |
| Se | <0.1 |
| Br | <0.1 |
| Rb | <0.1 |
| Sr | not tested |
| Y | major |
| Zr | 0.067 |
| Nb | <0.05 |
| Mo | 0.15 |
| Ru | <0.1 |
| Rh | <0.1 |
| Pd | <0.1 |
| Ag | <0.5 |
| Cd | <0.5 |
| In | <0.1 |
| Sn | 0.30 |
| Sb | 0.30 |
| Te | <0.5 |
| I | <0.1 |
| Cs | <0.1 |
| Ba | <0.5 |
| La | not tested |
| Ce | <0.1 |
| Pr | <0.1 |
| Nd | <0.1 |
| Sm | <0.1 |
| Eu | <0.1 |
| Gd | <0.1 |
| Tb | <0.1 |
| Dy | <0.1 |
| Ho | <0.1 |
| Er | <0.1 |
| Tm | <0.1 |
| Yb | <0.1 |
| Lu | <0.1 |
| Hf | <0.1 |
| Ta | <5 |
| W | 550 |
| Re | <0.1 |
| Os | <0.1 |
| Ir | <0.1 |
| Pt | <0.5 |
| Au | <0.5 |
| Hg | <0.1 |
| Tl | <0.1 |
| Pb | <0.1 |
| Bi | <0.1 |
| Th | <0.01 |
| U | <0.01 |

In evaluating the effect of tungsten on the optical properties of a NLO crystal grown with a tungsten solvent, it is helpful to consider FIG. 1. FIG. 1 illustrates the percent transmittance of a YAl$_3$(BO$_3$)$_4$ crystal grown with tungsten (YAB—W) compared to the percent transmittance of a YAl$_3$(BO$_3$)$_4$ crystal containing molybdenum (YAB—Mo) and the percent transmittance of a YAl$_3$(BO$_3$)$_4$ crystal that is substantially free of all transition-metal contaminants (YAB—La). As shown, the YAB—W crystal begins to absorb light at a wavelength that is longer than the wavelength at which the YAB—La crystal begins to absorb light, but shorter than the wavelength at which the YAB—Mo crystal begins to absorb light. For many applications, absorbance at shorter wavelengths is desirable. For these applications, the YAB—W crystal is preferable when compared to the YAB—Mo crystal, but still inferior to the YAB—La crystal.

After forming a crystal using the disclosed method, the uniform crystal structure can be verified by X-ray diffraction. The optical properties of the crystal can be tested by placing the crystal in a laser beam. For example, YAl$_3$(BO$_3$)$_4$ crystals can be tested in this manner to confirm the production of second-harmonic light.

NLO crystals formed by the disclosed method include NLO crystals, such as aluminum-borate NLO crystals, that are substantially free and/or contain less than about 100 ppm by weight, typically less than about 50 ppm by weight, and even more typically less than about 10 ppm by weight of any element that interferes with the generation and/or emission of light at desired wavelengths, such as wavelengths less than about 300 nm, typically less than about 250 nm, and even more typically less than about 175 nm. The secondary materials that interfere with the generation and/or emission of light at desired wavelengths can be, for example, transition-metal elements and lanthanides, other than yttrium, lanthanum, and lutetium. The crystals also can be classified by their concentration of molybdenum-containing compounds. Some crystals formed by the disclosed method are substantially free and/or contain less than about 100 ppm by weight, typically less than about 50 ppm by weight, and even more typically less than about 10 ppm by weight of any molybdenum-containing compound.

Figure 2:
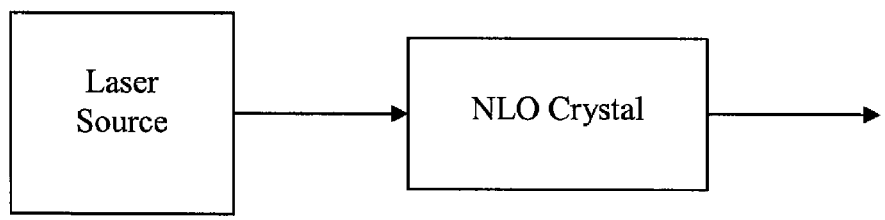
FIG. 2 is a schematic of a laser device that incorporates a NLO crystal.

The crystals described in this disclosure have many useful applications. For example, aluminum-borate NLO crystals, such as aluminum-borate NLO crystals that have chemical structures comprising yttrium, lutetium, or combinations thereof, can be incorporated into laser devices, such as the laser device illustrated in FIG. 2. Under certain conditions, these crystals are capable of generating and/or emitting short wavelength laser beams.

Laser beams can be used to detect anomalies on the surface of substrates, including semiconductor substrates. This is done, for example, by directing the laser beam in a pattern over the surface of the substrate, such as a raster pattern, and measuring the consistency of the reflected light. When the laser beam encounters an anomaly on the surface of the substrate, such as a particle, the reflected light will scatter. Shorter wavelength laser beams are especially useful because they can detect smaller anomalies. This is important in the semiconductor industry, where, as the feature size decreases, the size of the anomalies that can adversely affect device function also decreases.

Shorter wavelength laser beams also can be used to bore small diameter holes in substrates. These laser beams concentrate more energy in a smaller area than longer wavelength laser beams and are therefore able to impart more energy to the substrate. The ability to bore small diameter holes in a substrate is useful, for example, in the construction of features on a printed circuit board.

Having illustrated and described several different embodiments of the invention, it should be apparent to those skilled in the art that the invention may be modified in arrangement and detail. We claim as our invention all such modifications as come within the true spirit and scope of the following claims.

We claim:

1. A method for making a nonlinear optical crystal, comprising:
   providing a primary material and a solvent, where the solvent is substantially free of any element that inhibits the ability of the nonlinear optical crystal to generate and/or emit light at wavelengths less than about 200 nm; and
   recrystallizing the primary material to form a nonlinear optical crystal that is substantially free of any element that inhibits the ability of the nonlinear optical crystal to generate and/or emit light at wavelengths less than about 200 nm.

2. The method of claim 1 where the nonlinear optical crystal is an aluminum-borate nonlinear optical crystal.

3. The method of claim 2, where the solvent comprises $LaB_3O_6$, $MgB_2O_4$, $LiF$, $Li_2WO_4$, or combinations thereof.

4. The method of claim 2, where the solvent is substantially free of any single molybdenum-containing compound.

5. The method of claim 2, where the primary material is $YAl_3(BO_3)_4$ and the solvent comprises $LaB_3O_6$.

6. The method of claim 2, where the primary material is $LuAl_3(BO_3)_4$ and the solvent comprises $LaB_3O_6$.

7. The method of claim 2, where recrystallizing the primary material comprises mixing the primary material with a solvent to form a mixture and introducing a seed into the mixture.

8. The method of claim 7, where the seed consists essentially of the primary material.

9. The method of claim 7, where recrystallizing the primary material further comprises cooling the mixture and withdrawing the aluminum-borate nonlinear optical crystal from the mixture.

10. The method according to claim 1 where the nonlinear optical crystal is a $YAl_3(BO_3)_4$ crystal, and the method further comprises:
    mixing $YAl_3(BO_3)_4$ with a solvent to form a mixture, where the solvent is substantially free of any compound containing a transition-metal element and/or a lanthanide, other than yttrium, lanthanum, and lutetium;
    introducing a seed into the mixture;
    cooling the mixture from a first temperature at or above a melting point of the mixture to a second temperature below the melting point of the mixture over a growing period; and
    withdrawing the $YAl_3(BO_3)_4$ crystal from the mixture after cooling the mixture, where the growing period is longer than about 10 hours.

11. The method according to claim 1 where the nonlinear optical crystal is a $YAl_3(BO_3)_4$ crystal, and the method further comprises:
    providing a $YAl_3(BO_3)_4$ and a solvent, where the solvent is substantially free of any single molybdenum-containing compound; and
    recrystallizing the $YAl_3(BO_3)_4$ to form a $YAl_3(BO_3)_4$ crystal that comprises less than about 10 ppm by weight as molybdenum of any single molybdenum-containing compound.

12. The method according to claim 1 where the nonlinear optical crystal generates and/or emit light at wavelengths less than about 175 nm.

* * * * *